(12) United States Patent
Park et al.

(10) Patent No.: US 7,363,596 B1
(45) Date of Patent: Apr. 22, 2008

(54) METHODS FOR STORING AND NAMING STATIC LIBRARY CELLS FOR LOOKUP BY LOGIC SYNTHESIS AND THE LIKE

(75) Inventors: Ji Park, San Jose, CA (US); Jinyong Yuan, Cupertino, CA (US); Kar Keng Chua, Penang (MY); Evgenii Puchkaryov, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 413 days.

(21) Appl. No.: 11/115,641

(22) Filed: Apr. 27, 2005

(51) Int. Cl.
*G06F 17/50* (2006.01)

(52) U.S. Cl. .................. 716/1; 716/2; 716/4; 716/7

(58) Field of Classification Search ............ 716/1, 716/2, 4, 7
See application file for complete search history.

(56) References Cited

U.S. PATENT DOCUMENTS

| | | | |
|---|---|---|---|
| 5,696,693 A * | 12/1997 | Aubel et al. ............... | 716/8 |
| 5,825,202 A | 10/1998 | Tavana et al. | |
| 5,874,834 A | 2/1999 | New | |
| 6,091,262 A | 7/2000 | New | |
| 6,094,065 A | 7/2000 | Tavana et al. | |
| 6,242,945 B1 | 6/2001 | New | |
| 6,490,707 B1 | 12/2002 | Baxter | |
| 6,515,509 B1 | 2/2003 | Baxter | |
| 6,526,563 B1 | 2/2003 | Baxter | |
| 2004/0111691 A1 | 6/2004 | Tan et al. | |
| 2004/0261052 A1 | 12/2004 | Perry et al. | |

OTHER PUBLICATIONS

"LCELL WYSIWYG Description for the Stratix II Family", Version 1.1, Altera Corporation, Mar. 22, 2004.

* cited by examiner

*Primary Examiner*—Thuan Do
(74) *Attorney, Agent, or Firm*—Ropes & Gray LLP; Robert R. Jackson

(57) ABSTRACT

A method is provided for creating and using a library of known logic elements for facilitating the design of equivalent FPGA, structured ASIC, or other integrated circuits. Each cell in the library corresponds to a circuit element and contains equivalent circuit models of the element for implementation in different integrated circuit technologies. The cells are named and indexed using a library cell key that contains a fixed set of cell properties which uniquely characterize the function of the cell. The cell key can be used to locate cells in the library or in circuit designs, and to verify that the circuit models contained in the cell implement the correct logic function.

7 Claims, 4 Drawing Sheets

Illustrative naming convention:
<Prefix>_<Primary characteristic 1>_<Primary characteristic 2>_...
_<Secondary characteristic 1>_..._<Revision number>

Examples:
  LUT_5_0000026F_6HLEs_D4_V0
  5 input LUT ; LUT mask: 0000 026F ; 6 HLEs used in design ;
    Output drive strength: 4 ; Revision 0
  DFF_D1_CLK0_CLR1_D1_V2
  D flip-flop ; Basic register with inverted Clock ; Output drive strength: 1 ; Revision 2

| Functional Cell | Properties | | Common properties |
|---|---|---|---|
| | Primary | Secondary | |
| Look-up table (LUT) | Number of inputs<br>LUT Mask | Number of HLEs/CHLEs<br>Output drive strength<br>Revision number | Timing characteristics<br><br>Power characteristics |
| Flip-flop (DFF) | Input polarity<br>Clock polarity<br>Clr polarity | Number of HLEs<br>Output drive strength<br>Revision number | |
| Digital signal processor (DSP) | Mode<br>X-size<br>Y-size | Number of HLEs<br>Output drive strength<br>Revision number | |
| Latch | ... | ... | |
| Adder | ... | ... | |
| ... | ... | ... | |

FIG. 3

METHODS FOR STORING AND NAMING STATIC LIBRARY CELLS FOR LOOKUP BY LOGIC SYNTHESIS AND THE LIKE

BACKGROUND OF THE INVENTION

This invention relates to application-specific integrated circuits ("ASICs"), and more particularly to the type of ASICs that are sometimes known as structured ASICs.

So-called structured ASICs are sometimes used as alternatives to programmable logic devices ("PLDs") such as field-programmable gate arrays ("FPGAs"). An FPGA has a generic structure that may include many identical blocks of logic circuitry, many registers, and a number of other types of circuit blocks such as I/O blocks, RAM blocks, DSP blocks, PLL/DLL blocks, etc. These various circuitries are programmable to perform any of a variety of tasks. An FPGA also has a generic interconnection structure. This structure is programmable to interconnect the other circuitries on the device in any of many different ways. The logic blocks of such an FPGA may be referred to as logic elements, logic modules, adaptive logic elements, or adaptive logic modules ("LEs", "LMs", "ALEs", or "ALMs").

A known type of structured ASIC equivalent to an FPGA has a generic structure that includes at least the rudiments of many identical instances of a relatively simple circuit block (a so-called hybrid logic element or "HLE"). The structured ASIC may also generically include at least the rudiments of other blocks that are comparable to the special-purpose blocks on a related FPGA (e.g., I/O blocks, RAM blocks, PLL/DLL blocks, etc.). These generic attributes of the structured ASIC are embodied in several of the masks used to make the ASIC. These masks can therefore be the same or substantially the same for all ASICs of this general kind, and they give the ASIC its "structure." Other masks (but only some of the total mask set) are customized to give the structured ASIC particular functionality that is equivalent to the functionality of a related, programmed FPGA. For example, these customized masks may configure an HLE or a small group or cluster of HLEs (a complex HLE or "CHLE") to perform functions equivalent to those performed by an ALE in the related programmed FPGA. Similarly, the customized masks may configure a CHLE to perform functions equivalent to a register in the related programmed FPGA. The customized masks may also provide interconnections between HLEs, CHLEs, and/or other circuit blocks on the ASIC. These interconnections will typically include interconnections equivalent to those provided by the programmable interconnection resources of the related programmed FPGA.

Using a structured ASIC of this kind and in this way has a number of advantages. For example, only some of the ASIC masks need to be customized. This tends to reduce ASIC cost and to speed up the ASIC design/production cycle. It also reduces the risk of a design flaw in the ASIC, and it facilitates producing an ASIC that is a close operational equivalent to the related programmed FPGA (e.g., pin-for-pin identity, timing identity or near identity, etc.). Another advantage of this approach is that it tends to allow the ASIC to include less circuitry (including less circuitry for normal operations) than the related FPGA. This is so because only as many ASIC HLEs as necessary are devoted to performing the functions of each FPGA ALE, and in almost all FPGAs many ALEs are less than fully utilized.

Efficient and reliable conversion from FPGA designs to structured ASIC designs (and vice versa) is important to provision of FPGAs and ASICs that are equivalent to one another. For example, after a design has been proven in an FPGA, it may be desired to migrate that design to an ASIC in order to lower unit cost. As another example, it may be desired to use an FPGA to prototype a design that is really intended for ASIC implementation.

This invention provides methods for creating and accessing a library of equivalent functional circuit block models to be used in creating equivalent FPGA and structured ASIC designs. This invention also provides methods for naming and indexing cells stored in the library, to facilitate retrieval of cells from the library. This allows logic circuit designers to benefit from using pre-established circuit element equivalents that have been proven to be functional and correct.

SUMMARY OF THE INVENTION

The present invention provides methods for creating and using a library of known logic elements and their corresponding logic circuitry. Such a library can be used to facilitate the design of functionally equivalent FPGA, ASIC, or other integrated circuit implementations of a user's circuit design.

The library contains library cells corresponding to individual logic circuit elements. Each cell in the library corresponds to a single logic element such as a lookup table (LUT), a flip-flop (DFF), a latch, an adder, a digital signal processor (DSP), or any other functional logic element that includes basic logic circuitry. The logic elements can be produced in different integrated circuit technologies using integrated circuit building blocks such as LEs on an FPGA, CHLEs in a structured ASIC, or other arrangements of basic logic gates in other integrated circuit technologies.

To facilitate the design of equivalent FPGA, ASIC, or other implementations of a circuit design, each cell in the library contains equivalent models of the circuit element for implementation in various integrated circuit technologies. A cell may contain a behavioral model of the element, such a model corresponding to the set of programmed data required to implement the cell using an LE on an FPGA. A cell may contain a structural model of the element, such a model corresponding to the interconnections of HLEs and CHLEs required to implement the cell on a structured ASIC. A cell may also contain other models corresponding to the circuitry required to make the cell in various other integrated circuit technologies.

The cells in the library are named and/or indexed using a cell key format that uniquely identifies the function (e.g., the logic function) implemented by each cell. The cell key corresponds to a set of basic properties that fully characterize the function implemented by the circuit element or block corresponding to the library cell. The cell key, or the cell name containing the cell key, can be used for identifying the function of the cell, for verifying that the circuit models contained in the cell have the required functional properties, and for locating a particular cell or set of cells in the library. Furthermore, in order to retrieve a model of a cell implementing a particular function, the cell key corresponding to the function can be computed, and the model retrieved from the library cell whose name contains the cell key. Similarly, in order to locate a particular cell or set of cells in an integrated circuit design, the integrated circuit design files' names can be searched for the cell key, and the cell or cells located on the design.

The library may contain multiple library cells corresponding to the same function. Such cells have the same cell key. However, these cells may have different behavioral or circuit characteristics, may have different circuit models corresponding to them, or may differ in other ways. To distinguish between such library cells with identical functional cell keys, the names of cells in the library may contain other information in addition to their library cell key. For example, a cell version number or other cell characteristic may be included in the cell name to further differentiate between functionally similar cells.

Further features of the invention, its nature and various advantages, will be more apparent from the accompanying drawings and the following detailed description.

BRIEF DESCRIPTION OF THE DRAWINGS

FIG. 3 is a table showing some of the functional cell properties that may be used in creating a cell library or naming cells in accordance with the invention.

DETAILED DESCRIPTION

Figure 1:
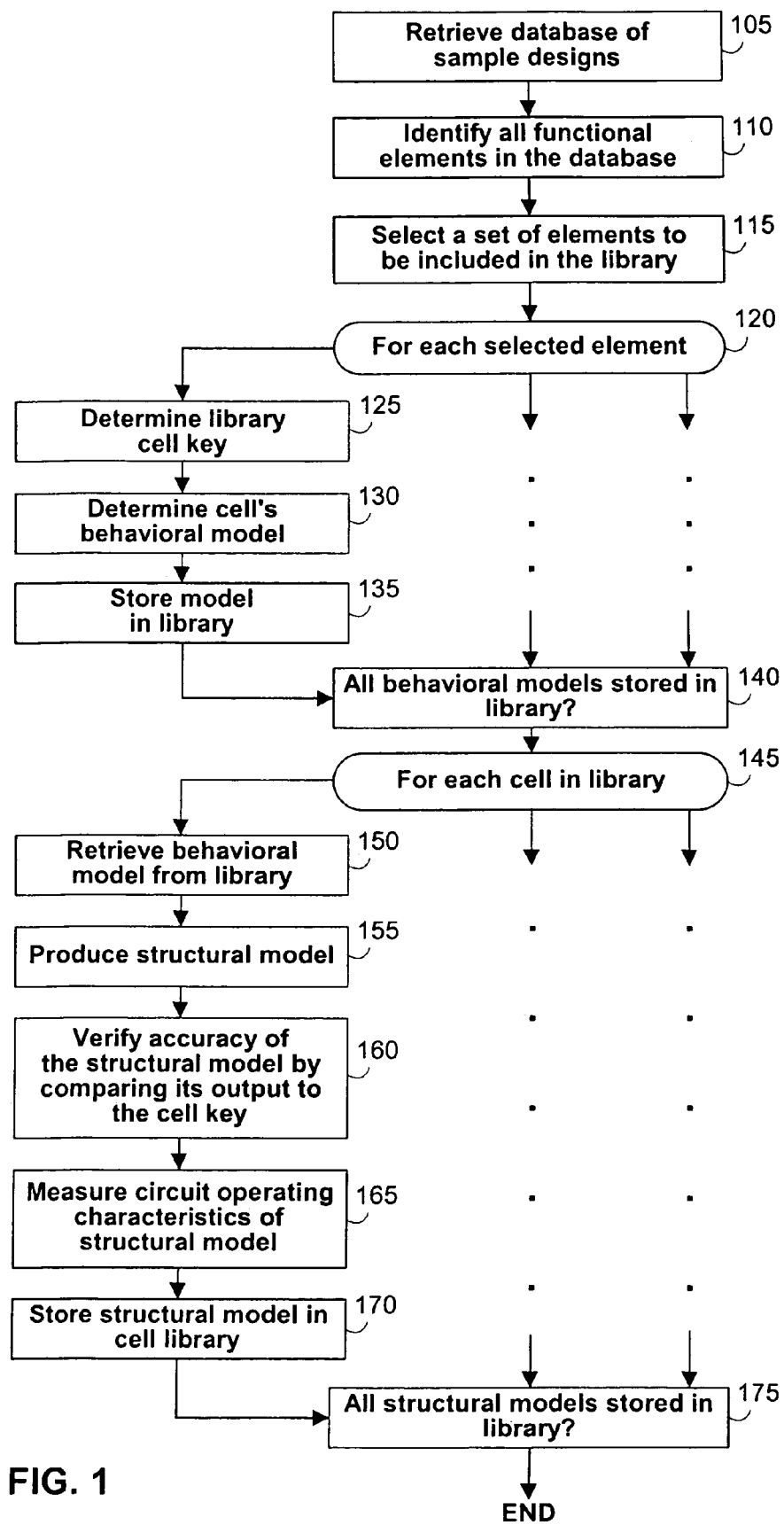
FIG. 1 is a simplified flow chart of steps that may be used to create and expand a cell library in accordance with the invention.

Before getting into the specifics of particular illustrative embodiments, it may be helpful to consider the following somewhat higher-level and more generalized discussion of some of the fundamental principles of the invention.

In accordance with the invention, circuit blocks that are potentially useful in different implementations of a user's logic design are given identifiers (names) that enable any block to be found again if it already exists in a library of such blocks. The identifier for a block can serve as a common key for accessing information about a block, regardless of the form of the block that is currently of interest. For example, a circuit block identifier in accordance with the invention may include "primary" information that captures the function performed by the block in such a way that any time a block with that function is encountered, the same primary identifier information will be computed again. An algorithm is therefore employed to determine the primary identifier information, so that such information is determined on a repeatable basis. This algorithm is preferably such that each different circuit block function produces different primary identifier information. In other words, the function uniquely specifies the primary identifier information, and the primary identifier information uniquely specifies the function. The primary identifier information also preferably has a form that lends itself to use as an index for searching (e.g., it is an alphanumeric string).

The primary identifier information is associated with all of the various forms of data about the associated circuit block that are in the above-mentioned library (which may in fact be several relatively separate sub-libraries that are used for different purposes). These different data forms may be used at various stages in the development of (1) an FPGA implementation of the user's logic design, or (2) a structured ASIC implementation of that design. The data for a block may be very different in these various stages, and it is helpful to have a common identifier for retrieving data for a block regardless of the form of the data (i.e., the implementation stage) that is currently of interest. For example, the data for a block may progress from primarily functional to increasingly structural as a design moves toward an actual FPGA or structured ASIC implementation, and the structural aspects are typically quite different for these two types of implementations. Nevertheless, each possible type of implementation may influence decisions that need to be made in effecting the other type of implementation. Thus the ability to cross-reference data for blocks between different types of implementations (and at various stages in those implementations), can be important. The same is true for such objectives as ensuring and/or verifying functional equivalence between different possible implementations of the user's logic design.

Some of the above-mentioned design implementation stages may yield information about a circuit block (or a particular implementation of a block) that it can be helpful to know in other contexts. For example, the number of structured ASIC HLEs that are needed for a structured ASIC implementation of a block may be helpful information to have in several contexts. As another example, if progressively more efficient structured ASIC implementations of a circuit block are developed over time, it may be desirable to keep all of these implementations in the library, but with respective "version" numbers so that we can either elect to remain with a particular previously used version or to move on to a later (or the latest) version. Information of the type mentioned in this paragraph can be added to circuit block identifiers, for example, to help distinguish and/or select from among multiple different implementations of the same circuit block function. This type of information may be referred to as "secondary" identifier information.

We turn now to a discussion of the invention in some particular illustrative contexts, and with reference to some particular illustrative embodiments of the invention.

This specification illustrates the invention in the context of developing equivalent logic designs for a particular type of FPGA and a particular type of structured ASIC. These types of FPGAs and structured ASICs are explained in more detail in such references as Chua et al. U.S. Pat. No. 7,243,329, Schleicher et al. U.S. patent application Ser. No. 10/050,607, filed Feb. 3, 2005, and Schleicher et al. U.S. patent application Ser. No. 11/097,633, filed Apr. 1, 2005, which are hereby incorporated by reference herein in their entireties.

The present invention relates to the desirability of having a library of known solutions to address the problem of developing equivalent logic functions that may be implemented in a user's FPGA logic design, in an equivalent structured ASIC design, or in an equivalent different type of integrated logic circuit design. In the particular illustrative context shown and described herein, the invention especially relates to building a library of known circuit model equivalents between LUT-based FPGA combinational logic functions and HLE-based structured ASIC designs, and possibly also physical implementations for those same logic functions. However, the method and approach described herein are also applicable to conversions of other functional logic elements such as flip-flops (DFFs), latches, digital signal processors (DSPs), adders, and other functional logic elements that can be formed using FPGA LEs, ASIC HLEs, or other logic circuit modules. The embodiment of the invention described below focuses on logic designs involving LUT-based FPGA designs and equivalent structured ASIC designs. This embodiment is illustrative, and does not preclude developing a similar library for other functional logic elements formed by logic modules.

FIG. 1 is a flow chart of a process (in accordance with the invention) of adding functional logic elements to a library of logic cells for which there are known structured ASIC CHLE and FPGA ALE equivalents to the functional logic elements. The process begins with step 105. In this step, a database of sample designs of logic circuits is retrieved.

In step 110, the functional elements present in all of the designs in the database are identified. Functional elements may be look-up tables (LUTs), registers, flip-flops (DFFs), latches, adders, digital signal processors (DSPs), or other functional logic elements that are composed of basic logic circuitry.

The functional elements are identified both by their type (LUT, DFF, DSP, or other) and by certain basic properties. These properties may include structural properties such as the number of inputs to the element, behavioral properties such as the LUT mask (a hexadecimal representation of the function implemented by the LUT) or DFF input or clock polarity, or other element properties which characterize the logic function implemented by the element. Functional elements are preferably identified by a combination of properties which fully characterize their functional output. In the case of a LUT, for example, these may include the number of inputs to the LUT and the LUT-mask.

Complex elements may be broken into a combination of more basic sub-elements. For example, LUTs with five or more inputs may be remapped as combinations of multiple LUTs with fewer inputs. The functional properties of the combination of sub-elements should remain identical to the functional properties of the original complex element.

Once all the functional logic elements in the design database have been identified, a subset of the elements is selected for further analysis in step 115. This subset may include all, none, or a portion of the identified elements. In a preferred embodiment, the selected elements correspond to those elements that most commonly occur in the database of designs, as well as other elements individually selected by a design team. The list of selected elements may include exhaustive lists of certain types of elements. For example, all LUTs with four inputs or less may be included in the list, while only commonly occurring LUTs with five to six inputs are included. Other selection criteria that may be used include the library users' requirements, the desired library size, or other appropriate selection criteria.

Those functional elements selected in step 115 are processed and added to the cell library (steps 120, 125, 130, and 135). Each functional element corresponds to one cell in the cell library. In a first step 125 in the process, each cell's key is established.

The cell key includes some of the cell's primary properties. The primary properties are a small set of characteristics that describe the logic function performed by the functional element. Some primary cell properties for common cell types are listed in the table of FIG. 3. In the case of a lookup table, primary properties may include the number of inputs and the LUT-mask. In the case of a DFF, the primary properties may include the input and clock polarities.

The cell key is a set of cell primary properties which fully characterizes the logical function performed by the cell or functional element. Thus, knowing a cell's type and its cell key, the logic function performed by the cell is fully determined. In the case of a LUT, the cell key format could be formed by the LUT's number of inputs and the LUT's mask. Other combinations of primary properties may also be used.

In a preferred embodiment of the invention, the cell name contains the information specified in the cell key. In such an embodiment, a cell with a desired functional characteristic can be located in the library of cells by searching for all library cells containing the desired cell key in their name. In another embodiment, the library can be indexed using the cell keys, and cells located by directly retrieving a particular cell key.

In step 130, the cell's behavioral model is established. The cell's behavioral model is a circuit design that performs the cell function determined by the cell key. The cell's behavioral model may correspond to the minimum NAND-mux architecture required to implement the circuit in a typical FPGA circuit architecture. A different circuit architecture may also be imposed on the cell's behavioral model. Other requirements may be imposed on the behavioral model, including but not limited to finding the smallest logic circuit that may be used to produce the specified logic function, or finding a model with specific timing constraints.

The behavioral model must have the same functional characteristics as those specified by the cell's key. To ensure that the behavioral model produces the required output, the model can be tested to ensure that its output corresponds to that specified in the cell's key.

The final step 135 involved in determining the cell's behavioral model is to save the cell's behavioral model and other cell information in the cell library. In a preferred embodiment of the invention, the cell is saved in the library using a naming convention that makes use of the cell key. The library may also be indexed using the cell key. The cell name may include an identifier specifying the type of cell (LUT, DFF, adder, DSP, other), identifiers specifying the cell key, a cell revision number, and any other information that may be relevant to uniquely identifying the cell in the library.

Once the behavioral models of all cells selected in step 115 are established and saved in the cell library, control passes to step 140. Step 140 verifies that all cells selected for inclusion in the library have been considered.

In steps 145, 150, 155, 160, 165, and 170, the structural model of each cell is established. For each cell included in the library in previous steps, the behavioral model of the cell is retrieved from the library in step 150. The behavioral model is then translated into a structural model of the cell (step 155). The structural model specifies the interconnections between logic elements that are required to perform the cell logic function performed by the behavioral model. In a preferred embodiment, the structural model specifies the physical connections required for a particular structured ASIC design to implement the circuit. The structural model can also specify the interconnections required to implement the cell's function in other types of integrated circuitry. The structural model may be designed to implement a circuit similar to that implemented by the behavioral model. The structural model may alternatively implement a different logic circuit than that implemented by the behavioral model, the logic circuit nonetheless having the same cell key as the behavioral model.

Once the cell's structural model is established, the model is tested to verify that it implements the required logic function (step 160). The output of the structural model is compared to the output expected from an ideal functional cell having the same cell key as the structural model. If any discrepancy exists between the output of the structural model and that predicted by the cell key, the structural model is corrected or a new one is established.

If the structural model's output corresponds to the cell function specified by the cell key, the circuit operating characteristics of the structural model are measured (step 165). These characteristics may include cell timing characteristics, cell output drive strength, the number of HLEs or CHLEs required for a structured ASIC implementation of the cell, internal routing of the cell or power characteristics.

In step 170, the structural model of the cell and the structural model's circuit operating characteristics are added to the element's library cell. In this step, the cell's name may also be amended to include additional information characterizing the cell. In a preferred embodiment, LUT cell names are amended to include the number of HLEs or CHLEs used by the cell, and the output drive strength of the cell.

After each cell has gone through structural modeling steps 145 through 170, the process of adding cell elements to the library ends (step 175).

Figure 2:
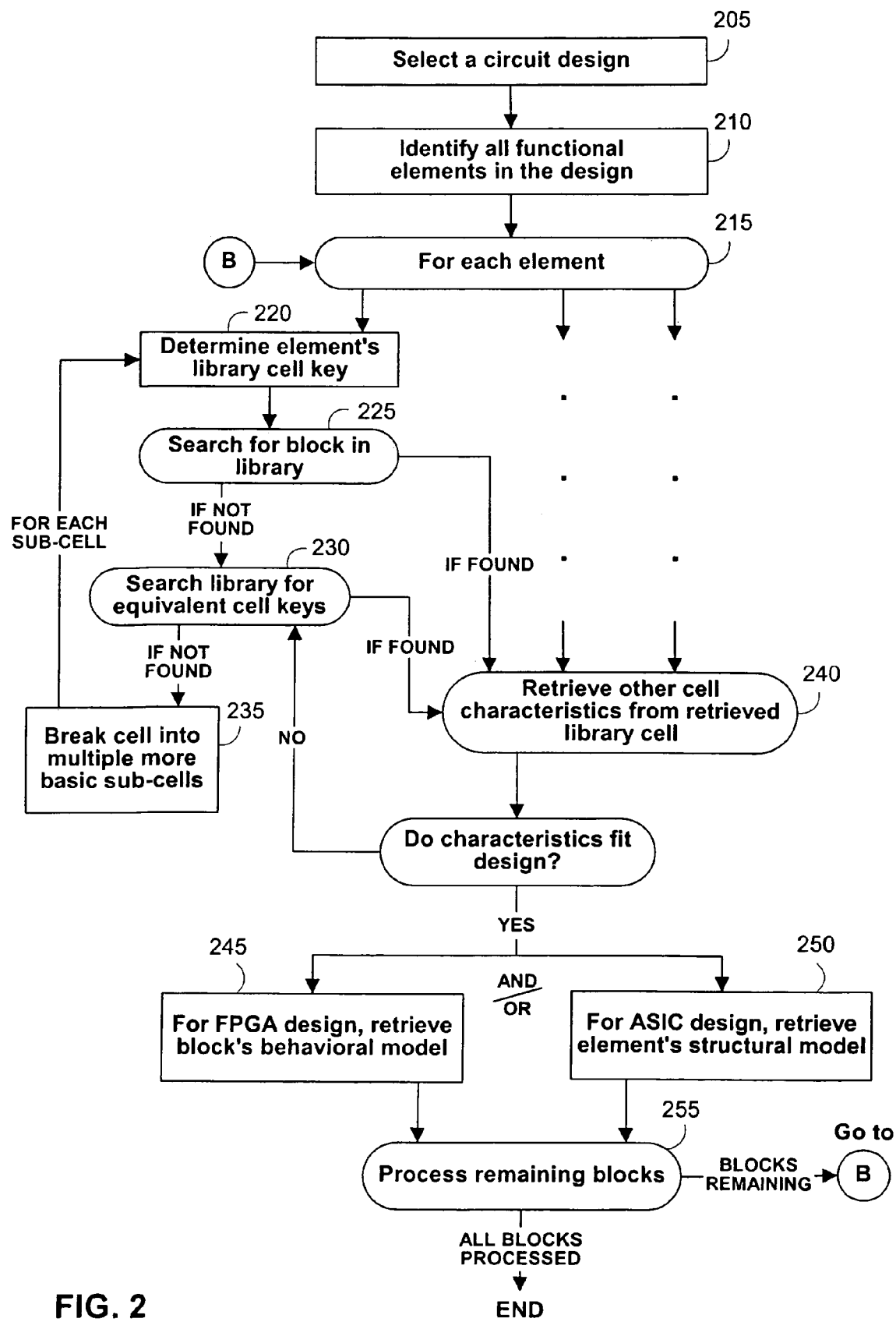
FIG. 2 is a simplified flow chart of steps that may be involved in retrieving cell information from the cell library in accordance with the invention.

FIG. 2 is a simplified flow chart of the preferred means of accessing and retrieving cells from a library of cells during the design of an integrated logic circuit. The integrated circuit under consideration may be an FPGA, a structured ASIC, or any other integrated circuit including logic circuitry. The flow chart of FIG. 2 also shows the process of accessing and retrieving cells from a library in the design of equivalent integrated circuits of different types, such as the design of equivalent FPGA and structured ASIC designs.

The process begins with the selection of a logic circuit design in step 205. The design may be intended for implementation on an FPGA, a structured ASIC, or any other type of integrated circuit including logic circuitry. In step 210, the functional elements in the logic circuit design are identified. The process of identifying functional elements is analogous to that described in step 110 of FIG. 1 (refer to detailed description above). The functional elements are identified both by their type (LUT, DFF, DSP, or other) and by their cell key or other primary cell properties. Complex elements may be broken into a combination of more basic sub-elements.

When all the elements in the design have been identified, steps 220, 225, and the following steps are repeated for each of the elements identified in the design. In step 220, each element's library cell key is identified. Using the cell key, the library is searched for instances of the element (step 225). In a preferred embodiment, the name of each cell in the library contains the cell key information. In such an embodiment, searching the library for instances of the cell requires searching cell names for the desired cell key. In another preferred embodiment, the library is indexed using the cell key of each library cell, allowing users to more efficiently locate cells in the library by directly retrieving the cell or set of cells with a particular cell key.

If the cell is not found in the library, the library is searched for alternate equivalent cell keys (step 230). Equivalent cell keys are cell keys that correspond to behaviorally similar cells. For example, equivalent cell keys may correspond to LUTs with differently ordered inputs, but otherwise identical characteristics. If no library instances of cells with equivalent cell keys are found, the cell is broken into multiple simpler sub-cells in step 235. Each of the sub-cells then goes through step 220 and the following steps.

If the cell is found in the cell library (step 225), or if a cell with an equivalent cell key is found (step 230), the cell's additional properties are retrieved from the library in step 240. The additional properties include timing characteristics, output drive strength, the number of HLEs required for implementation of the cell, as well as any other cell characteristics stored in the cell library. If the characteristics do not fit the requirements of the design, and if no other versions of the cell with the required characteristics are present in the library, control is passed to step 230 to find alternate instances of the cell in the library.

Otherwise, if the cell characteristics fit the requirements of the design, the cell's complete model information is retrieved from the library. In the illustrative embodiment presented here, the cell's behavioral model can be retrieved for an FPGA design, and its structural model can be retrieved for a structured ASIC design.

Steps 220, 225, 230 and 235 as required, 240, and 245 and/or 250 are repeated for each functional element in the design. Once all elements have been processed and their corresponding behavioral or structural models retrieved from the library, the library search is finished.

The table in FIG. 3 shows some of the properties of logic elements that may be used in identifying and characterizing functional logic cells and their corresponding structural and behavioral models. The table contains properties for LUTs, DFFs, and DSPs. The table is not meant to be an exhaustive listing of cell types or cell or model properties, but rather to provide examples of primary, secondary and common properties that may be used in naming library cells in methods similar to those described in the above specification.

FIG. 3 also contains examples of library cell names formed in accordance with the naming convention corresponding to a preferred embodiment of this invention. The naming convention provides a standard way to name each library cell before the behavioral and structural models of the cell are established. The cell name contains the cell key. The cell key remains invariant through the design process and can be used to verify that the behavioral and structural models of the cell implement the desired logic function. The naming convention includes in the name of each library cell a prefix corresponding to the element type (LUT, DFF, DSP, adder, etc.), identifiers corresponding to the cell primary characteristics contained in the cell key, identifiers corresponding to secondary characteristics included in the cell name, and a revision number for the cell. The naming convention allows searching the library for cells of particular functional types, with particular cell keys, or with other characteristics. The naming convention also allows searching logic circuit designs for any instances of library cells included in the design.

Figure 4:
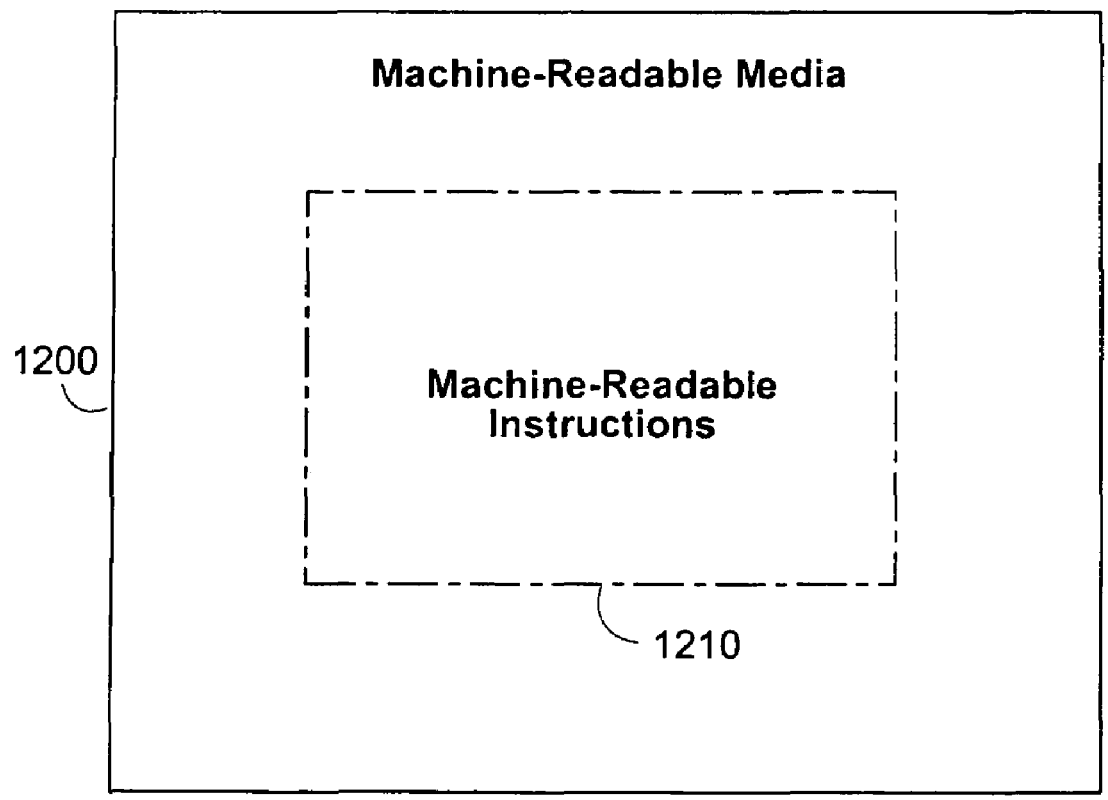
FIG. 4 is a simplified block diagram of illustrative machine-readable media in accordance with a possible aspect of the invention.

FIG. 4 illustrates another possible aspect of the invention. This is machine-readable media 1200 (e.g., magnetic disc(s), optical disc(s), magnetic tape(s), or the like) encoded with machine-readable instructions 1210 (e.g., a computer program) for at least partly performing one or more methods in accordance with the invention.

The invention claimed is:

1. A method of identifying functional circuit blocks comprising:
    determining a library cell name for each of the circuit blocks, the library cell name including at least a library cell key that uniquely identifies the function of the block and that is computed from the function of the block using an algorithm so that the same library cell key is computed whenever a circuit block having that function is considered; and
    adding a secondary characteristic portion to the library cell name for at least some of the circuit blocks, the secondary characteristic portion being indicative of a secondary characteristic of a particular integrated circuit technology implementation of that circuit block, wherein the library cell key for at least some of the blocks includes information derived from a standard form of data stored in a look-up table to cause the look-up table to perform the function.

2. The method of claim 1 wherein the library cell key for at least some of the blocks includes information derived from the number of inputs to the block.

3. The method defined in claim 1 wherein the secondary characteristic portion for at least some of the blocks includes information derived from a number of circuit units required to implement the block in the particular integrated circuit technology implementation.

4. The method defined in claim 1 wherein the secondary characteristic portion for at least some of the blocks includes information derived from an output signal strength of the block in the particular integrated circuit technology implementation.

5. The method defined in claim 1 wherein at least some of the blocks have plural particular integrated circuit technology implementations, and wherein for each such block, the method further comprises:

identifying each particular integrated circuit technology implementation by including in the secondary characteristic portion an index value that is unique to that particular integrated circuit technology implementation.

6. The method defined in claim 5 wherein the plural particular integrated circuit technology implementations of at least one of the blocks are developed as successive versions, and wherein the index values for those implementations includes a respective version number for each of those implementations.

7. Machine-readable media encoded with machine-readable instructions for performing the method defined in claim 1.

* * * * *